United States Patent [19]

Mogi

[11] Patent Number: 5,528,016

[45] Date of Patent: Jun. 18, 1996

[54] DRYING APPARATUS FOR USE IN PHOTOSENSITIVE MATERIAL PROCESSING SYSTEM

[75] Inventor: Fumio Mogi, Kanagawa, Japan

[73] Assignee: Fuji Photo Film Co., Ltd., Kanagawa, Japan

[21] Appl. No.: 241,783

[22] Filed: May 12, 1994

[30] Foreign Application Priority Data

May 13, 1993 [JP] Japan ................................ 5-111554

[51] Int. Cl.$^6$ ................................................ H05B 1/02
[52] U.S. Cl. ...................... 219/486; 219/492; 219/388; 219/485; 392/411; 392/417; 355/291
[58] Field of Search ............................... 219/497, 483, 219/485, 486, 501, 494, 388, 492; 355/282, 286, 291; 392/411, 417

[56] References Cited

U.S. PATENT DOCUMENTS

| | | | |
|---|---|---|---|
| 4,321,457 | 3/1982 | Edel et al. ............................... | 219/497 |
| 4,439,931 | 4/1984 | Mizuta ....................................... | 34/44 |
| 4,560,431 | 12/1985 | Inselmann ............................... | 156/359 |
| 4,657,572 | 4/1987 | Desai et al. ............................. | 65/1 |
| 5,004,891 | 4/1991 | Landis ..................................... | 219/388 |

*Primary Examiner*—Mark H. Paschall
*Attorney, Agent, or Firm*—Sughrue, Mion, Zinn, Macpeak & Seas; Richard C. Turner; Joseph J. Buczynski

[57] ABSTRACT

A drying apparatus for use in a photosensitive material processing system, which is designed so that nonuniformity of drying in a direction intersecting a belt-shaped photosensitive material, e.g., a photographic negative film, photographic paper, etc., is eliminated, and the overall electric power capacity of the system is minimized. A plurality of electric current heaters ($44_1$ and $44_2$) are disposed in parallel in a direction intersecting belt-shaped photosensitive materials ($F_1$ and $F_2$) transported, and each electric current heater is individually current-controlled to change the temperature distribution of the heated air, thereby compensating for the nonuniformity of drying of the belt-shaped photosensitive materials ($F_1$ and $F_2$) in the lateral direction, for example. The electric current heaters ($44_1$ and $44_2$) are individually current-controlled by making the current input time different for each electric current heater. Thus, it is possible to minimize the rush current and the overall electric power capacity of the system.

11 Claims, 3 Drawing Sheets

DRYING APPARATUS FOR USE IN PHOTOSENSITIVE MATERIAL PROCESSING SYSTEM

BACKGROUND OF THE INVENTION

The present invention relates to a drying apparatus for use in a photosensitive material processing system. More particularly, the present invention relates to a drying apparatus for use in a photosensitive material processing system which is designed to dry a belt-shaped photosensitive material, e.g., a photographic film, photographic paper, etc., in a drying box as such a photosensitive material passes through it.

In an automatic developing processor, which is one type of photosensitive material processing system, a belt-shaped photosensitive material, e.g., a photographic negative film, photographic paper, etc., is successively dipped in various processing solutions while being transported by transport rollers, thereby effecting various processing, i.e., development, fixing and washing. After such processing, the photosensitive material is dried in a drying apparatus before being discharged to the outside of the processing machine.

The drying apparatus has a drying box designed to dry a photosensitive material as passed through it. The drying box is supplied with circulating drying air.

Hitherto, the temperature control for a heater in the drying apparatus has been effected by a single control system. There has heretofore been substantially no example in which two or more control systems are used for the control of the heater, except for the control of electric power capacity (wattage). There has been no example in which the balance control of the circulating air is attained by the control of the heater.

For example, in a case where the drying apparatus of a small-sized photosensitive material processing system called "mini-lab" is designed to use circulating air, as described above, there is no serious problem as long as the circulating air intake opening and the circulating air passage are provided in well-balanced (e.g., bisymmetrical) relation to the photosensitive material passage. However, if circulating air openings are provided on only one side of the drying apparatus or cannot be arranged in a well-balanced layout, a temperature distribution occurs in the drying apparatus.

The temperature distribution exerts a serious influence on the drying characteristics of the photosensitive material, causing the quality of the processing to be degraded. Particularly, in the case of a parallel processing machine wherein two belt-shaped photosensitive materials are processed while being transported in parallel along respective passages, the drying rate differs between the two photosensitive material passages, and it is difficult to appropriately control the drying conditions for both of them.

Another problem is that if the heater uses a material with which the heater resistance is likely to change with temperature, the rush current becomes large. Thus, it is necessary to design the photosensitive material processing system so that the safety factor for the electric power capacity is large.

SUMMARY OF THE INVENTION

In view of the above-described problems of the prior art, it is an object of the present invention to provide a drying apparatus used in a photosensitive material processing system to dry a belt-shaped photosensitive material, e.g., a photographic negative film, photographic paper, etc., by heated air, which is designed so that nonuniformity of drying in a direction intersecting the photosensitive material is eliminated, and the overall electric power capacity of the photosensitive material processing system is minimized.

The present inventors have found that a temperature distribution, which is produced in the drying part of a photosensitive material processing system because circulating air for drying cannot circulate in a well-balanced manner, can be controlled and uniform drying can be performed by using a heater having a unit structure which includes two or more heater units and scheming a temperature control method for the heater, and that the rush current can be minimized by energizing (i.e., inputting current to) the two or more heater units with a time delay with respect to each other. The present invention has been accomplished on the basis of this finding.

That is, the present invention provides a drying apparatus used in a photosensitive material processing system to dry by heated air a belt-shaped photosensitive material processed in a liquid processing part, wherein a plurality of electric current heaters are disposed in parallel in a direction intersecting the belt-shaped photosensitive material transported, and each electric current heater is individually current-controlled to change the temperature distribution of the heated air, thereby compensating for the nonuniformity of drying of the belt-shaped photosensitive material.

In this case, the electric current heaters are individually current-controlled by making the current input time different for each electric current heater. Thus, it is possible to minimize the overall electric power capacity of the system.

The present invention may also be effectively applied to an apparatus wherein at least a part of heated air after contacting the belt-shaped photosensitive material is sucked from either of the two lateral directions intersecting the belt-shaped photosensitive material, although not limitative thereto. The present invention is particularly useful in an apparatus of the type in which the heated air sucked as described above is reheated by the electric current heaters.

In the present invention, a plurality of electric current heaters are disposed in parallel in a direction intersecting the belt-shaped photosensitive material transported, and each electric current heater is individually current-controlled to change the temperature distribution of the heated air, thereby compensating for the nonuniformity of drying of the belt-shaped photosensitive material. Accordingly, it is possible to optimize the drying conditions for the photosensitive material with a simple arrangement without modifying the conventional system to a considerable extent and to eliminate the nonuniformity of the drying conditions. In addition, the electric current heaters are individually current-controlled by making the current input time different for each electric current heater, thereby enabling the rush current to be minimized. Thus, it is possible to minimize the overall electric power capacity of the system and hence possible to reduce the size, weight and cost of the system.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

The drying apparatus for use in a photosensitive material processing system according to the present invention will be described below in detail by way of one embodiment and with reference to the accompanying drawings.

Figure 1:
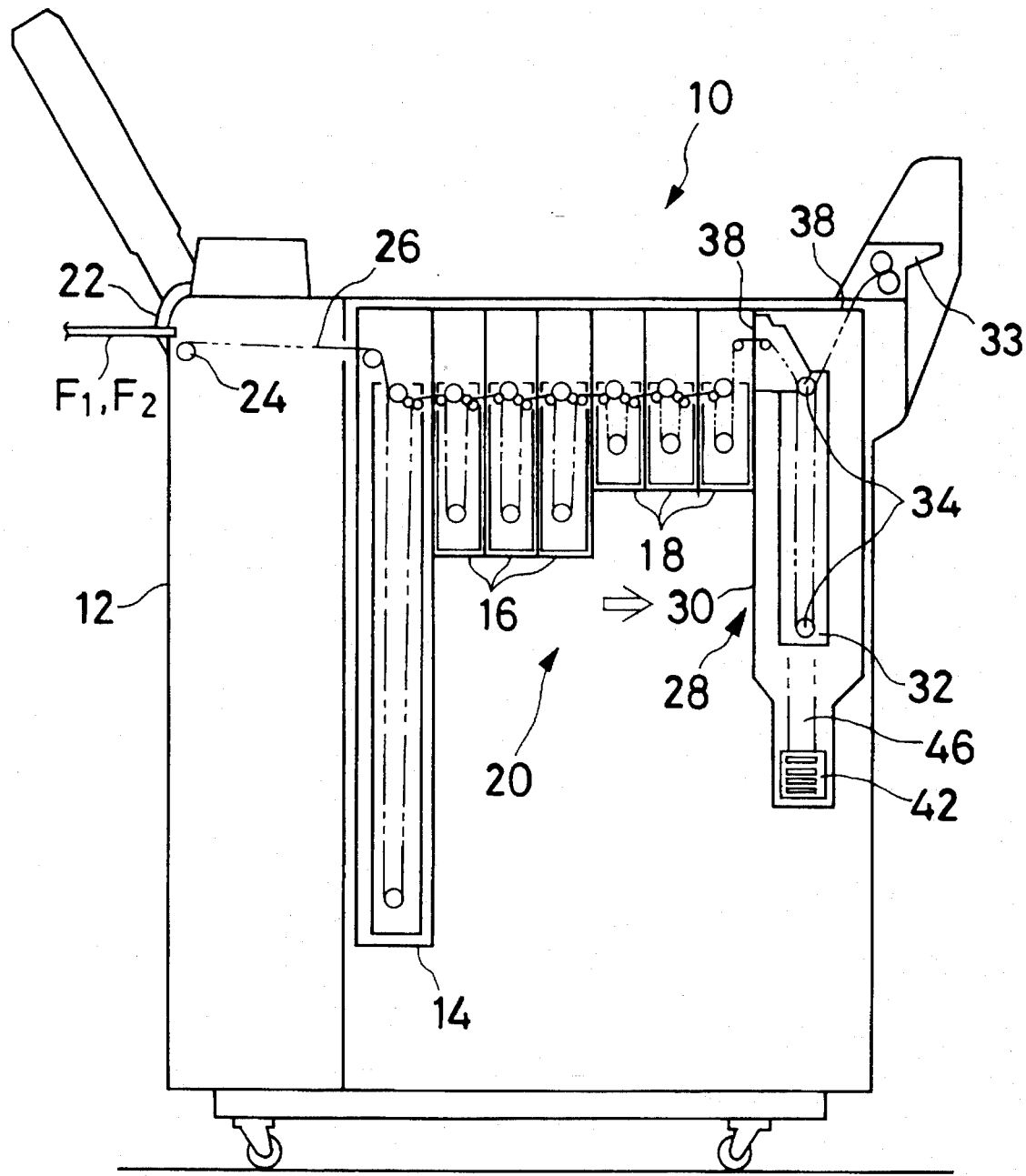
FIG. 1 schematically shows the general arrangement of an automatic developing processor for a photographic negative film that uses a drying apparatus according to one embodiment of the present invention.

FIG. 1 schematically shows the general arrangement of an automatic developing processor 10 for a photographic negative film as a photosensitive material processing system. The automatic developing processor 10 has a housing 12 in which a processing part 20 is provided. The processing part 20 is composed of a developing tank 14, a bleach-fix tanks 16, and washing and stabilizing tanks 18. Two photographic negative films $F_1$ and $F_2$, which constitute photosensitive materials, are fed in parallel into the housing 12 from a film feed part 22 and successively sent to the developing tank 14, the bleach-fix tanks 16, and the washing and stabilizing tanks 18 along a transport path 26 by a plurality of rollers 24. Thus, development, bleach-fix, and washing and stabilizing processing are carried out.

In the housing 12, a drying apparatus 28 is provided subsequently to the processing part 29. In the drying apparatus 28, a drying box 30 is disposed adjacently to the washing and stabilizing tanks 18. The drying box 30 is supplied with circulating drying air to dry the negative films $F_1$ and $F_2$, which have already been subjected to development and other processing, by the drying air in the course of being transported in a U-shape in the drying box 30. The dried negative films $F_1$ and $F_2$ are discharged to the outside of the machine from a discharge part 33.

Figure 2:
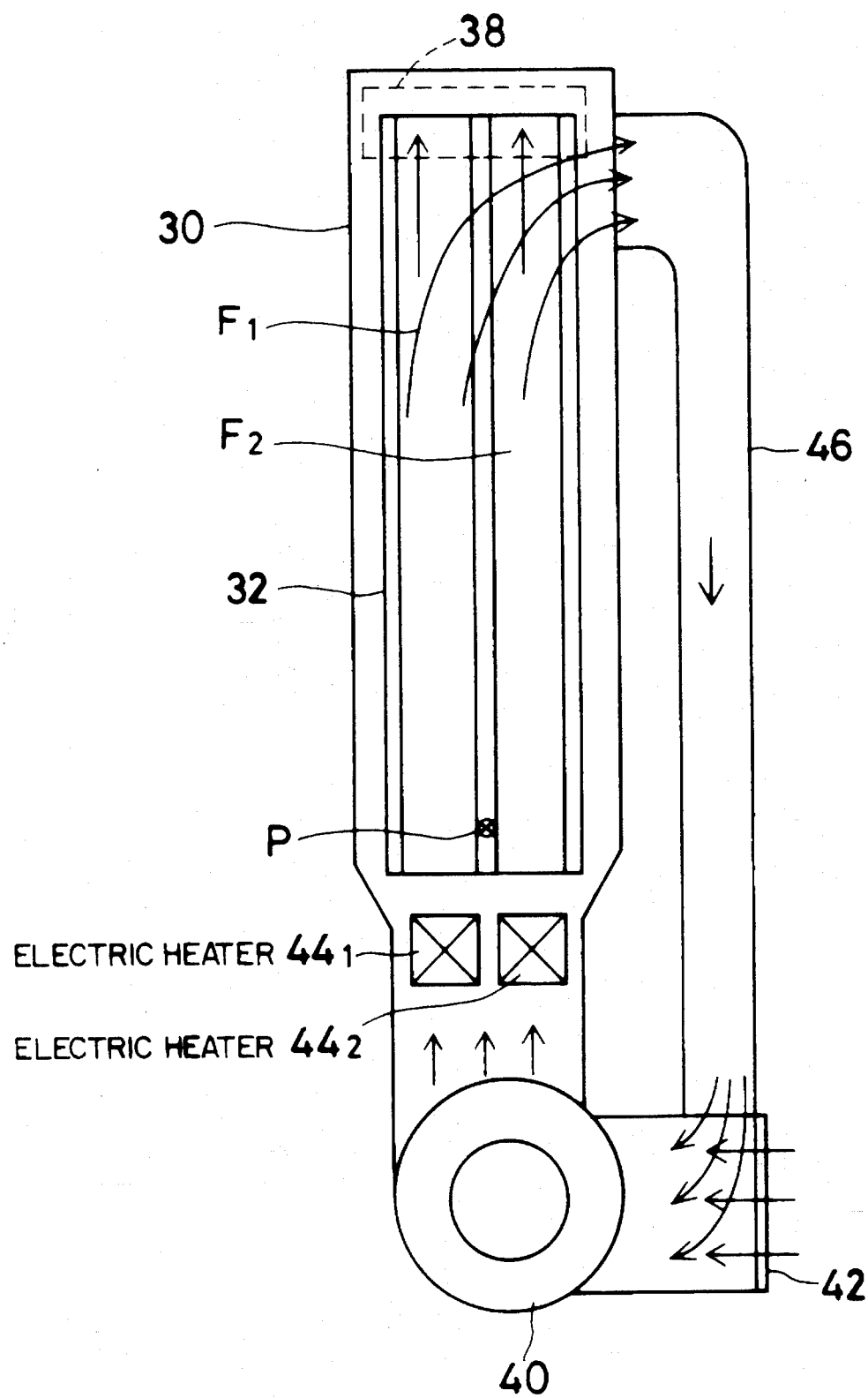
FIG. 2 shows the drying apparatus according to one embodiment of the present invention as viewed in the direction of the double arrow in FIG. 1.

FIG. 2 shows the drying apparatus 28 as viewed in the direction of the double arrow in FIG. 1. The drying box 30 is formed in the shape of a square cylinder and provided therein with a drying rack 32. Transport rollers 34 (see FIG. 1) are rotatably supported on the drying rack 32 to transport the negative films $F_1$ and $F_2$, which are moved in parallel in the drying rack 32. The upper end portion of the drying box 30 is provided with inlet and outlet ports 38 through which the negative films $F_1$ and $F_2$ enter and leave the drying box 30. The negative films $F_1$ and $F_2$ entering the drying box 30 through the inlet port 38 are first transported downwardly in the drying box 30 and then bent upwardly by the lower transport roller 34. Thus, the negative films $F_1$ and $F_2$ are sent to the discharge part 33 from the outlet port 38 along the U-shaped transport passage.

In addition, a blower 40 is attached to the lower end portion of the drying box 30 to send fresh air to the upper part of the drying box 30, which is introduced from an outside air intake opening 42 provided in the right-hand side of the lower end of the drying box 30 as viewed from the film feed part 22. Heaters $44_1$ and $44_2$ are disposed between the blower 40 and the lower end of the drying rack 32 in the drying box 30. Thus, the air sent from the blower 40 rises while being heated as it passes through the heaters $44_1$ and $44_2$, thereby drying the negative films $F_1$ and $F_2$ passing through the drying rack 32. A part of the heated air sent along the negative films $F_1$ and $F_2$ is released to the outside from the inlet and outlet ports 38, while the rest of the heated air is recirculated to the blower 40 through a duct 46 which connects together the right-hand side of the upper end of the drying box 30 and the outside air intake opening 42.

Thus, in the drying apparatus 28 of the present invention, a mixture of the outside fresh air and a part of the heated air is circulated, thereby making the drying process efficient. However, as will be clear from FIG. 2, the heated air to be recirculated is likely to flow rightwardly upward in the drying box 30 toward the top right corner of the drying box 30 because it is sucked into the duct 46 from the right-hand side of the upper end of the drying box 30. Therefore, it is likely that a temperature distribution will be produced inside the drying box 30, particularly in the upper part thereof. In this embodiment, the right-hand side as viewed in FIG. 2 becomes higher in temperature and hence more easily dryable than the left-hand side. Accordingly, the right-hand side negative film $F_2$ is more heated and dried, whereas the left-hand side negative film $F_1$ is relatively short of drying.

Therefore, in this embodiment, the two heaters $44_1$ and $44_2$ are divided in a direction intersecting the negative films $F_1$ and $F_2$ transported in parallel, as shown in FIG. 2, and the heater energization control is effected according to a detection output from a temperature sensor, which is disposed in a passage central portion P above the heaters $44_1$ and $44_2$, as follows: The heaters $44_1$ and $44_2$ are energized not simultaneously and similarly but in a staggered manner such that the heater $44_1$ for the side of the drying area in the drying box 30 where the temperature would otherwise become relatively low is first energized, and the heater $44_2$ for the side where the temperature would otherwise become relatively high is then energized with a delay. By doing so, it is possible to compensate for a temperature difference between the left and right sides of the upper part of the drying box 30.

Figure 3:
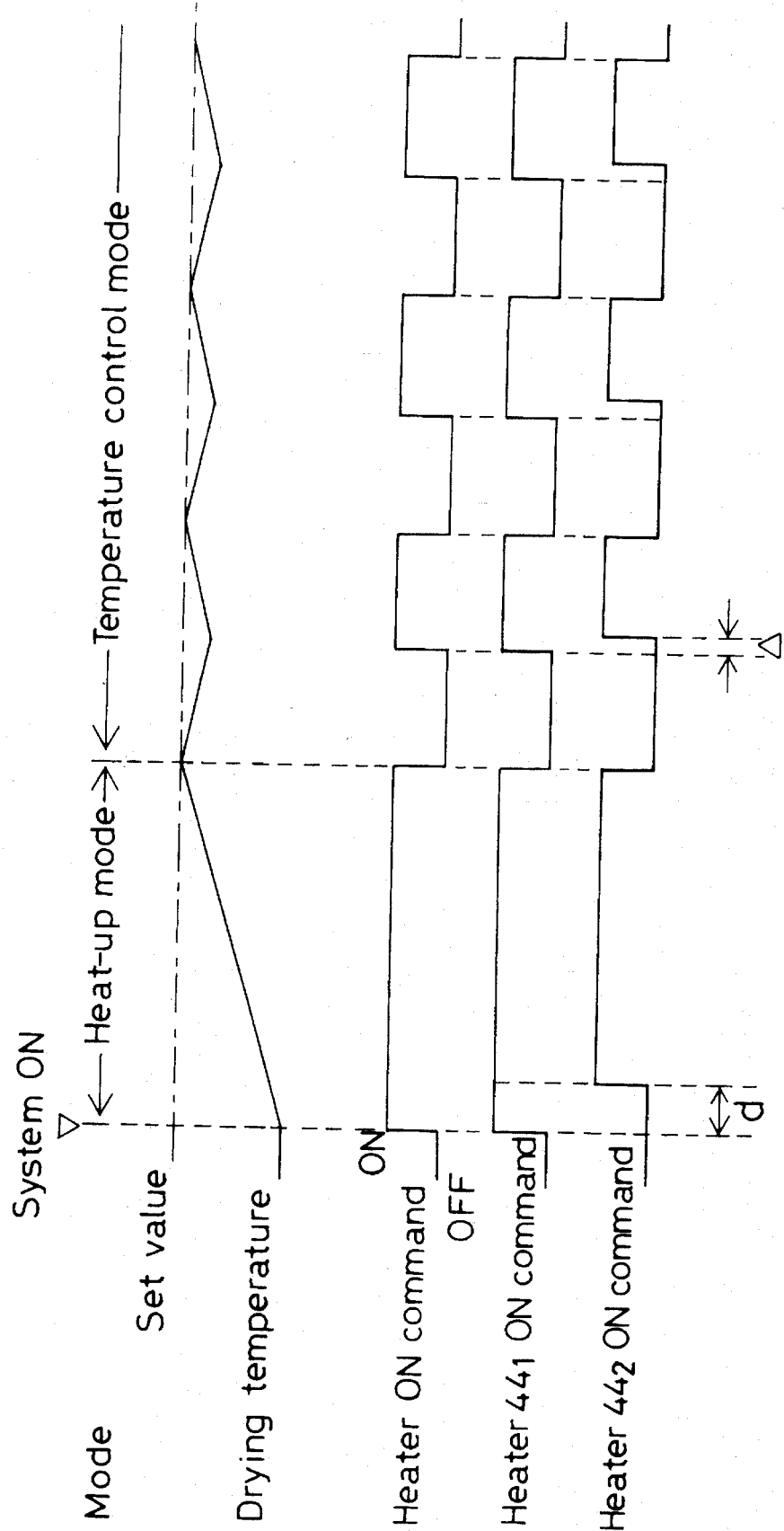
FIG. 3 shows one example of a timing chart for control in the present invention.

FIG. 3 shows one example of the timing chart for the energization control. When the automatic developing processor 10 is turned on, the mode of the drying apparatus 28 enters the heat-up mode for raising the temperatures of the heaters $44_1$ and $44_2$, and a heater ON command is issued. On the basis of this command, energization of the heater $44_1$ is first initiated to supply an electric current thereto for a longer time in order to compensate for a lowering in temperature, as described above. After time d has elapsed, energization of the heater $44_2$ for the side where the temperature would otherwise become relatively high is initiated. Consequently, the effective temperatures of heat applied to the negative films $F_1$ and $F_2$ rise at approximately the same rate on both sides of a direction intersecting the negative films $F_1$ and $F_2$. When the temperature sensor, which is disposed at the position P, detects that the temperature of the circulating air has reached a set value, a heater OFF command is issued, and the two heaters $44_1$ and $44_2$ are simultaneously deenergized on the basis of the command. Thereafter, the mode of the drying apparatus 28 enters the temperature control mode. When the temperature sensor detects that the temperature of the circulating air has become lower than the set value, a heater ON command is reissued. On the basis of the command, energization of the heater $44_1$ is first initiated, and energization of the heater $44_2$ is then initiated with a time delay Δ. When the temperature sensor detects that the temperature of the circulating air has reached the set value, a heater OFF command is issued, and the energization of the two heaters $44_1$ and $44_2$ is simultaneously terminated on the basis of the command.

Thus, the heater $44_1$ for the side where the temperature would otherwise become relatively low is first energized, and the heater $44_2$ for the side where the temperature would otherwise become relatively high is then energized with a predetermined time delay, and the energization of the two heaters $44_1$ and $44_2$ is simultaneously terminated, thereby compensating for the nonuniformity of the drying temperature due to the asymmetry of the heated air circulating passage, for example, and thus enabling uniform heat-drying. It should be noted that the above-described time d is set at 5 seconds, for example, and the time Δ is set at 1 second, for example. However, the system should be arranged so that both the times d and Δ can be adjusted to optimal values in the range of from 0.01 second to several seconds according to the circulating air temperature difference between the left and right sides.

With the foregoing arrangement, the maximum value of the rush current in the whole system can be lowered by initiating energization of the two heaters $44_1$ and $44_2$ at different timings, and thus the electric power capacity of the system can be minimized. Accordingly, it is possible to reduce the size, weight and cost of the system. It should be noted that the arrangement may be such that energization of the two heaters $44_1$ and $44_2$ is initiated at the same time, but the energization termination timings are made different from each other instead. It is also possible to make both the energization initiation and termination timings different between the two heaters $44_1$ and $44_2$. The arrangement may also be such that both the energization initiation and termination timings are the same for the two heaters $44_1$ and $44_2$, but the electric energy supplied to the heater $44_1$ is made larger than that supplied to the heater $44_2$.

The above-described arrangement is adapted to compensate for a difference in the temperature distribution between the left and right sides due to the asymmetry of the heated air circulating passage. There is also a likelihood that the temperature distribution may vary with the change of the flow rate of air sent from the blower 40 caused by a change of the frequency of the current supplied to the motor of the blower 40 from 50 Hz to 60 Hz, for example. In such a case, optimal drying conditions can be obtained by appropriately correcting the time differences d and Δ. Further, the temperature distribution may vary in the same way as the above when the two negative films $F_1$ and $F_2$ are different in the size or type. In such a case also, optimal drying conditions can be obtained by appropriately correcting the time differences d and Δ. The present invention can also effectively be applied to cases where the heat capacities of the left- and right-hand sides of the drying area are different from each other, or where a high- or low-temperature region is present in either side.

Although the foregoing arrangement is adapted for a case where two films to be dried are transported in parallel, it should be noted that the present invention is also effective for a case where a single film is transported for drying, from the viewpoint of preventing nonuniform drying which might otherwise occur at the opposite sides of the film. The present invention is also effective for a case where three or more films are transported for drying. Although in the foregoing arrangement two heaters are disposed in parallel in a direction intersecting the belt-shaped photosensitive material and individually subjected to the energization temperature control, three or more heaters may be disposed in the same way and individually subjected to the energization temperature control. It should be noted that the belt-shaped photosensitive material as an object of drying may be photographic paper or other photosensitive material in addition to photographic negative films.

As will be clear from the foregoing description, the drying apparatus for use in a photosensitive material processing system according to the present invention has a plurality of electric current heaters disposed in parallel in a direction intersecting a belt-shaped photosensitive material transported, and each electric current heater is individually current-controlled to change the temperature distribution of the heated air for drying, thereby compensating for the nonuniformity of drying of the belt-shaped photosensitive material. Accordingly, it is possible to optimize the drying conditions for the photosensitive material with a simple arrangement without modifying the conventional system to a considerable extent and to eliminate the nonuniformity of the drying conditions. In addition, the electric current heaters are individually current-controlled by making the current input time different for each electric current heater, thereby enabling the rush current to be minimized. Thus, it is possible to minimize the overall electric power capacity of the system and hence possible to reduce the size, weight and cost of the system.

What I claim is:

1. A drying apparatus used in a photosensitive material processing system to dry by heated air a belt-shaped photosensitive material processed in a liquid processing part, said drying apparatus comprising:

a plurality of electric current heaters disposed proximate to each other in a direction intersecting the belt-shaped photosensitive material being transported, each electric current heater being individually energized at a different time with respect to other of said heaters based on a predetermined period of time to change a temperature distribution of the heated air through said drying apparatus to compensate for nonuniformity of drying the belt-shaped photosensitive material.

2. A drying apparatus according to claim 1, wherein said electric current heaters are individually energized by making current input time different for each electric current heater.

3. A drying apparatus according to claims 1 or 2, further comprising a chamber which sucks at least a part of the heated air which has contacted the belt-shaped photosensitive material from either of two lateral directions intersecting the belt-shaped photosensitive material.

4. A drying apparatus according to claim 3, where the chamber includes a portion which directs said at least a part of the heated air toward said electric current heaters so that said at least a part of said heated air is reheated.

5. A drying apparatus according to claim 1, wherein said heaters are energized at different times while said photosensitive material is being transported in said drying apparatus.

6. A drying apparatus according to claim 1, further comprising a temperature sensor which controls said electronic current heaters to be de-energized when detecting a predetermined temperature in said drying apparatus.

7. A drying apparatus according to claim 1, wherein one of the heaters is always energized before one other of the heaters.

8. A drying apparatus according to claim 1, wherein said electric current heaters are disposed in parallel in a direction intersecting the belt-shaped photosensitive material being transported.

9. A drying apparatus according to claim 1, further comprising a drying box through which said photosensitive material is transported, said heaters being energized at different times when said film is being transported through said heating box so that at least one of said heaters is de-energized for a predetermined period of time when said film is being transported through said box.

10. A drying apparatus according to claim 1, further comprising a drying box through which said photosensitive material is transported, said plurality of heaters being disposed parallel to each other at one end of said drying box so that air flowing through each of said heaters enters said drying box at different locations thereof.

11. A drying apparatus according to claim 10, wherein said heater disposed proximate to a side of said drying box out of which a part of said heated air is sucked through a chamber is always energized after other of said heaters have been energized.

* * * * *